(12) United States Patent
Hu et al.

(10) Patent No.: US 11,575,111 B2
(45) Date of Patent: Feb. 7, 2023

(54) OPTICAL FILM GROUP, DISPLAY ASSEMBLY AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Weipin Hu, Beijing (CN); Hong Yang, Beijing (CN); Chun Wang, Beijing (CN); Congcong Wei, Beijing (CN); Mingxiao Jiang, Beijing (CN); Qianqian Bu, Beijing (CN); Xiao Sun, Beijing (CN); Yun Qiu, Beijing (CN); Dan Wang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 404 days.

(21) Appl. No.: 16/887,438

(22) Filed: May 29, 2020

(65) Prior Publication Data
US 2021/0036264 A1    Feb. 4, 2021

(30) Foreign Application Priority Data
Jul. 31, 2019    (CN) .......................... 201910702425.X

(51) Int. Cl.
*H01L 51/52*    (2006.01)
*G02B 5/30*    (2006.01)
(Continued)

(52) U.S. Cl.
CPC ........ *H01L 51/5281* (2013.01); *G02B 5/3058* (2013.01); *G02B 5/3083* (2013.01);
(Continued)

(58) Field of Classification Search
CPC ......... G02F 1/133536; G02F 1/133548; G02F 1/133638; G02B 5/3083; G02B 5/3058;
(Continued)

(56) References Cited

U.S. PATENT DOCUMENTS

2007/0069635 A1* 3/2007 Cok ..................... H01L 51/5268
                                                    313/504
2008/0237611 A1* 10/2008 Cok ..................... H01L 51/5284
                                                    257/79
(Continued)

FOREIGN PATENT DOCUMENTS

CN    101783360 A    7/2010
CN    101946195 A    1/2011
(Continued)

OTHER PUBLICATIONS

Notification of the First Office Action issued in Chinese Patent Application No. 201910702425.X, dated Jan. 19, 2021; with English translation.

*Primary Examiner* — Mariam Qureshi
(74) *Attorney, Agent, or Firm* — McDermott Will & Emery LLP

(57) ABSTRACT

A display assembly includes a display panel and at least one optical film group each disposed on a display surface. Each optical film group includes a quarter-wave plate, a reflective polarizer and an absorbing polarizer. The reflective polarizer includes a reflective portion capable of allowing light with a polarization direction parallel to a polarization axis of the reflective polarizer to pass through and reflecting light with a polarization direction perpendicular to the polarization axis. An orthographic projection of an effective light-emitting area of at least one sub-pixel is substantially within an orthographic projection of the reflective portion. The absorbing polarizer is capable of allowing light with a polarization direction parallel to a polarization axis of the
(Continued)

absorbing polarizer to pass through and absorbing light with a polarization direction perpendicular to the polarization axis. The polarization axis of the reflective polarizer is parallel to the polarization axis of the absorbing polarizer.

20 Claims, 14 Drawing Sheets

(51) Int. Cl.
  *H01L 27/32* (2006.01)
  *H01L 51/56* (2006.01)
  *G02F 1/13363* (2006.01)
  *G02F 1/1335* (2006.01)

(52) U.S. Cl.
  CPC .... *G02F 1/133638* (2021.01); *H01L 27/3244* (2013.01); *H01L 51/56* (2013.01); *G02F 1/133536* (2013.01); *G02F 1/133548* (2021.01); *H01L 2251/533* (2013.01); *H01L 2251/5315* (2013.01)

(58) Field of Classification Search
  CPC .............. G02B 27/286; H01L 51/5281; H01L 2251/5315; H01L 2251/533; H01L 51/5256; H01L 27/32
  See application file for complete search history.

(56) References Cited

U.S. PATENT DOCUMENTS

| | | | |
|---|---|---|---|
| 2008/0252799 A1* | 10/2008 | Lee | G02F 1/13362 359/485.05 |
| 2010/0177113 A1* | 7/2010 | Gay | G02B 30/27 359/484.04 |
| 2010/0182552 A1 | 7/2010 | Park et al. | |
| 2010/0320494 A1 | 12/2010 | Kim et al. | |
| 2016/0118448 A1 | 4/2016 | Epstein et al. | |
| 2017/0205550 A1 | 7/2017 | Zhu et al. | |
| 2018/0358583 A1* | 12/2018 | Ye | H01L 51/5284 |

FOREIGN PATENT DOCUMENTS

| | | |
|---|---|---|
| CN | 105264684 A | 1/2016 |
| CN | 105467499 A | 4/2016 |
| CN | 109256488 A | 1/2019 |
| WO | 2014/085199 A1 | 6/2014 |

* cited by examiner

OPTICAL FILM GROUP, DISPLAY ASSEMBLY AND DISPLAY DEVICE

CROSS-REFERENCE TO RELATED APPLICATION

This application claims priority to Chinese Patent Application No. 201910702425.X, filed Jul. 31, 2019, which is incorporated herein by reference in its entirety.

TECHNICAL FIELD

The present disclosure relates to the field of display technologies, and in particular, to an optical film group, a display assembly and a display device.

BACKGROUND

An organic light-emitting diode (OLED) display device has characteristics of self-luminescence, no backlight requirement, high contrast, small thickness, wide viewing angle, fast response speed, applicability in a flexible panel, wide temperature range, simple structure, ease of manufacturing, and the like.

SUMMARY

In one aspect, a display assembly is provided. The display assembly includes a display panel and at least one optical film group each disposed on a display surface of the display panel. Each optical film group includes a quarter-wave plate, a reflective polarizer and an absorbing polarizer arranged sequentially along a thickness direction of the display panel. The reflective polarizer includes a reflective portion capable of allowing light with a polarization direction parallel to a polarization axis of the reflective polarizer to pass through and reflecting light with a polarization direction perpendicular to the polarization axis of the reflective polarizer; and an orthographic projection of an effective light-emitting area of at least one sub-pixel on a plane parallel to the display surface of the display panel is substantially within an orthographic projection of the reflective portion on the plane. The absorbing polarizer is capable of allowing light with a polarization direction parallel to a polarization axis of the absorbing polarizer to pass through and absorbing light with a polarization direction perpendicular to the polarization axis of the absorbing polarizer; and the polarization axis of the reflective polarizer is parallel to the polarization axis of the absorbing polarizer.

In some embodiments, the reflective polarizer is a wire-gird polarizer.

In some embodiments, the wire-gird polarizer includes a plurality of metal wires which are arranged at equal intervals, a width of each metal wire is in a range from 50 nm to 60 nm, and a fill factor of the wire-gird polarizer is in a range from 0.4 to 0.6.

In some embodiments, the display panel is a bottom-emitting display panel, and the at least one optical film group includes one optical film group. The reflective polarizer further includes a plurality of light-transmissive portions, an orthographic projection of a non-light-emitting area of each sub-pixel on the plane is substantially within an orthographic projection of a respective one of the plurality of light-transmissive portions on the plane.

In some embodiments, the orthographic projection of the reflective portion on the plane substantially coincides with the orthographic projections of effective light-emitting areas of the plurality of sub-pixels on the plane.

In some embodiments, the light-transmissive portions includes at least one transparent portion and/or at least one opening.

In some embodiments, the display panel is a top-emitting display panel, and the at least one optical film group includes one optical film group disposed on the display surface of the display panel. Orthographic projections of non-light-emitting areas of the plurality of sub-pixels on the plane are substantially within the orthographic projection of the reflective portion on the plane.

In some embodiments, the display panel has an active area, the plurality of sub-pixels are located in the active area, and the reflective portion covers the entire active area.

In some embodiments, the display panel is a double-sided light-emitting display panel, and the at least one optical film group includes a first optical film group and a second optical film group. The first optical film group is disposed on a display surface of the display panel, the reflective polarizer in the first optical film group further includes a plurality of light-transmissive portions, and an orthographic projection of a non-light-emitting area of each sub-pixel on the plane is substantially within an orthographic projection of a respective one of the plurality of light-transmissive portion on the plane. The second optical film group is disposed on an opposite display surface of the display panel; orthographic projections of non-light-emitting areas of the plurality of sub-pixels on the plane are within the orthographic projection of the reflective portion of the reflective polarizer in the second optical film group on the plane.

In some embodiments, the display panel further includes a substrate disposed between the plurality of sub-pixels and the quarter-wave plate. The quarter-wave plate is in contact with a surface of the substrate facing away from the sub-pixels, the reflective polarizer is in contact with a surface of the quarter-wave plate facing away from the substrate, and the absorbing polarizer is in contact with a surface of the reflective polarizer facing away from the quarter-wave plate.

In some embodiments, the reflective polarizer includes a transparent base and metal wires disposed on the transparent base. The quarter-wave plate is disposed on surfaces of the metal wires facing away from the transparent base, and the absorbing polarizer is disposed on a surface of the transparent base facing away from the metal wires.

In some embodiments, the display assembly further includes a substrate disposed between the reflective polarizer and the absorbing polarizer. The quarter-wave plate is in contact with the display surface of the display panel, the reflective polarizer is in contact with a surface of the quarter-wave plate facing away from the display panel, the substrate is in contact with a surface of the reflective polarizer facing away from the quarter-wave plate, and the absorbing polarizer is in contact with a surface of the substrate facing away from the reflective polarizer.

In some embodiments, the display assembly further includes a substrate disposed between the quarter-wave plate and the reflective polarizer. The quarter-wave plate is in contact with the display surface of the display panel, the substrate is in contact with a surface of the quarter-wave plate facing away from the display panel, the reflective polarizer is in contact with a surface of the substrate facing away from the quarter-wave plate, and the absorbing polarizer is in contact with a surface of the reflective polarizer facing away from the substrate.

In some embodiments, the display panel further includes a substrate disposed on surfaces of the plurality of sub-pixels facing away from the display surface, the quarter-wave plate is disposed on a side of the plurality of sub-pixels away from the substrate, the reflective polarizer is in contact with a surface of the quarter-wave plate facing away from the plurality of sub-pixels, and the absorbing polarizer is in contact with a surface of the reflective polarizer facing away from the quarter-wave plate.

In some embodiments, the reflective polarizer includes a transparent base and metal wires disposed on the transparent base. The quarter-wave plate is disposed on surfaces of the metal wires facing away from the transparent base, and the absorbing polarizer is disposed on a surface of the transparent base facing away from the metal wires.

In some embodiments, the display panel further includes a substrate disposed between the plurality of sub-pixels and the first optical film group. In the first optical film group, the quarter-wave plate is in contact with a surface of the substrate facing away from the plurality of sub-pixels, the reflective polarizer is in contact with a surface of the quarter-wave plate facing away from the substrate, and the absorbing polarizer is in contact with a surface of the reflective polarizer facing away from the quarter-wave plate. In the second optical film group, the quarter-wave plate is in contact with surfaces of the plurality of sub-pixels facing away from the substrate, the reflective polarizer is in contact with a surface of the quarter-wave plate facing away from the plurality of sub-pixels, and the absorbing polarizer is in contact with a surface of the reflective polarizer facing away from the quarter-wave plate.

In some embodiments, the reflective polarizer in the first optical film group includes a first transparent base and first metal wires disposed on the first transparent base; the reflective polarizer in the second optical film group includes a second transparent base and second metal wires disposed on the second transparent base. In the first optical film group, the quarter-wave plate is disposed on surfaces of the first metal wires facing away from the first transparent base, and the absorbing polarizer is disposed on a surface of the first transparent base facing away from the first metal wires. In the second optical film group, the quarter-wave plate is disposed on surfaces of the second metal wires facing away from the second transparent base, and the absorbing polarizer is disposed on a surface of the second transparent base facing away from the second metal wires.

In another aspect, a display device is provided. The display device includes the display assembly as described above and a driving assembly. The driving assembly is configured to provide display data and control signals to the display assembly.

In yet another aspect, an optical film group is provided. The optical film group is a display film group included in the display assembly.

BRIEF DESCRIPTION OF THE DRAWINGS

In order to describe technical solutions in embodiments of the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art can obtain other drawings according to these drawings without paying any creative effort. In addition, accompanying drawings in the following description may be regarded as schematic diagrams, and are not limitations on an actual size of a product, an actual process of a method and an actual timing of signals that the embodiments of the present disclosure relate to.

DETAILED DESCRIPTION

Figure 1:
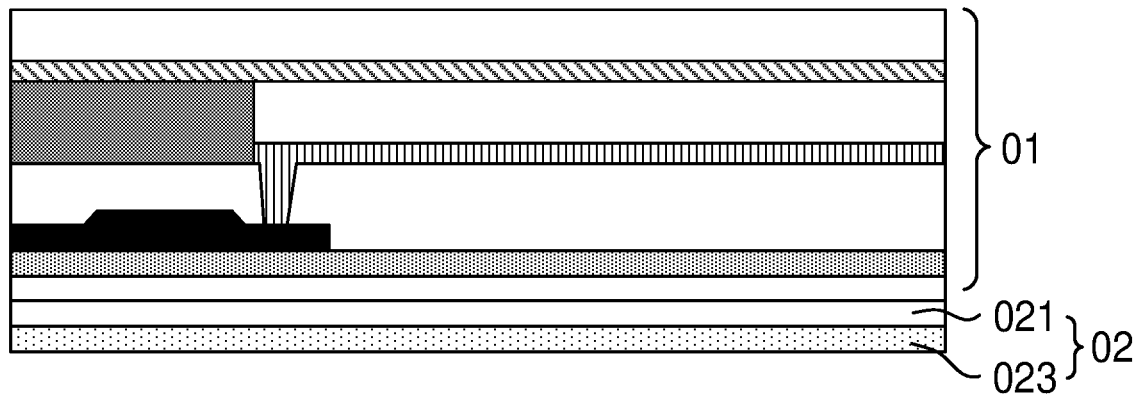
FIG. 1 is a schematic section of a display assembly.

Technical solutions in some embodiments of the present disclosure will be described clearly and completely with reference to accompanying drawings below. Obviously, the described embodiments are merely some but not all of the embodiments of the present disclosure. All other embodiments obtained on a basis of the embodiments of the present disclosure by a person of ordinary skill in the art shall be included in the protection scope of the present disclosure.

Unless the context requires otherwise, term "comprise" and other forms thereof such as the third-person singular form "comprises" and the present participle form "comprising" in the description and the claims are construed as open and inclusive, i.e., "inclusive, but not limited to". In the description of the description, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to same embodiment(s) or example(s). In addition, the specific features, structures, materials or characteristics may be included in any or more embodiments or examples in any suitable manner.

Terms such as "first" and "second" are used for descriptive purposes only and are not to be construed as indicating or implying the relative importance or implicitly indicating the number of indicated technical features below. Therefore, a feature defined by the term "first" or "second" may include one or more of the features, either explicitly or implicitly. In the description of the embodiments of the present disclosure, term "plurality" means two or more unless otherwise specified.

"At least one of A, B, and C" has a same meaning as "at least one of A, B, or C", and both include the following combinations of A, B, and C: only A, only B, only C, a combination of A and B, a combination of A and C, a combination of B and C, and a combination of A, B, and C. "A and/or B" includes the following combinations of A and B: only A, only B, and a combination of A and B.

In the description of embodiments of the invention, it will be understood that orientations or positional relationships indicated by terms "center", "upper", "lower", "front", "rear", "left", "right", "vertical", "horizontal", "top", "bottom", "inner", "outer", etc. are based on orientations or positional relationships shown in the drawings, which merely to facilitate and simplify the description of embodiments of the invention, but not to indicate or imply that the referred devices or elements must have a particular orientation, or must be constructed or operated in a particular orientation. Therefore they should not be construed as limitations to the invention. In the description of the present invention, "a plurality of" means two or more unless otherwise specified.

As shown in FIG. 1, a display assembly includes a display panel 01, such as an organic light-emitting diode (OLED) display panel, and a circular polarizer 02 disposed on a display surface of the display panel 01. The circular polarizer 02 is composed of a quarter-wave plate 021 and an absorbing polarizer 023. If the circular polarizer 02 is not provided, ambient light may enter the display panel 01 from the display surface of the display panel 01, and then may be reflected by structures such as a metal layer in the display panel 01. As a result, the reflected ambient light is mixed into light emitted by the display panel 01, causing the reflected ambient light to interfere with the light emitted by the display panel 01, which reduces contrast of the display panel 01.

Figure 2:
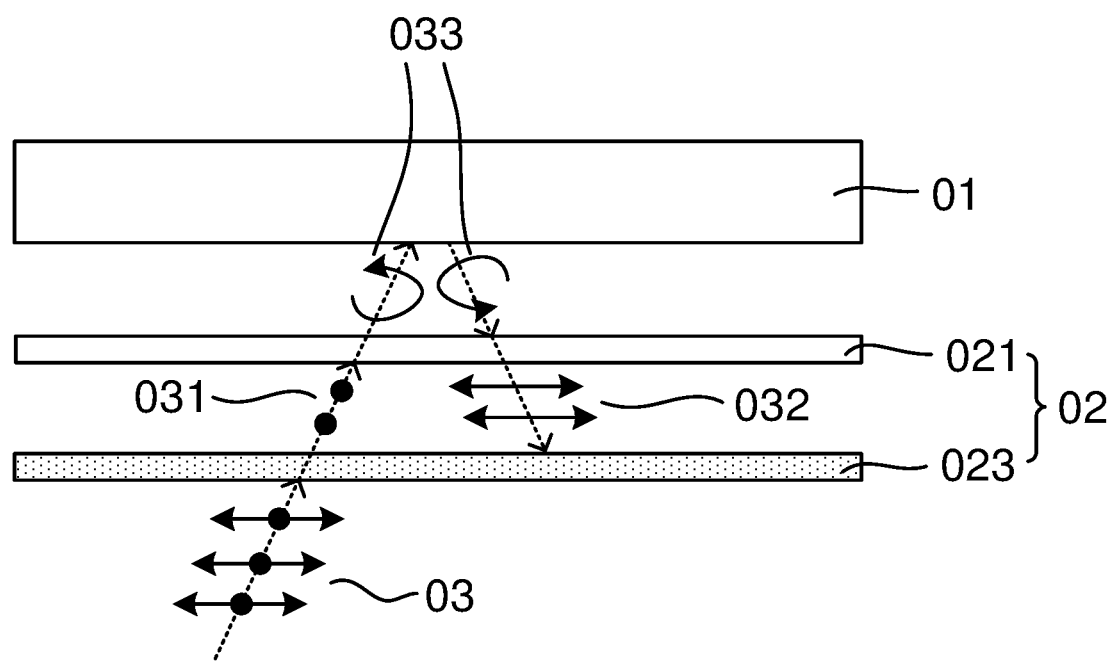
FIG. 2 is a schematic diagram showing the principle of preventing ambient light reflection by the display assembly in FIG. 1.

The ambient light is natural light, and may be resolved into linearly polarized light with two polarization directions perpendicular to each other. For example, as shown in FIG. 2, ambient light 03 is resolved into linearly polarized light with a polarization direction perpendicular to the paper (represented by the dot) and linearly polarized light with a polarization direction parallel to the paper (represented by the line segment with arrows at both ends). In a case where the circular polarizer 02 is provided, in the linearly polarized light resolved from the ambient light, the linearly polarized light with a polarization direction parallel to a polarization axis of the absorbing polarizer 023 is able to pass through the absorbing polarizer 023, and linearly polarized light with a polarization direction perpendicular to the polarization axis of the absorbing polarizer 023 is not able to pass through the absorbing polarizer 023 and is absorbed by the absorbing polarizer 023. In an example where the polarization axis of the absorbing polarizer 023 is perpendicular to the paper, the linearly polarized light with the polarization direction perpendicular to the paper is able to pass through the absorbing polarizer 023 and the linearly polarized light with the polarization direction parallel to the paper is not able to pass through the absorbing polarizer 023.

The linearly polarized light with the polarization direction parallel to the polarization axis of the absorbing polarizer 023 is referred to as first linearly polarized light 031. The first linearly polarized light 031 passes through the absorbing polarizer 023, and then passes through a quarter-wave plate 021 to become circularly polarized light 033. The circularly polarized light 033 is reflected by structures such as a metal layer in the display panel 01, and then passes through the quarter-wave plate 021 again to become linearly polarized light, which is referred to as second linearly polarized light 032. Due to an effect of the quarter-wave plate 021, there is a 90° difference between a polarization direction of the second linearly polarized light 032 and the polarization direction of the first linearly polarized light 031. That is to say, the polarization direction of the second linearly polarized light 032 is perpendicular to the polarization axis of the absorbing polarizer 023, and the second linearly polarized light 032 is not able to pass through the absorbing polarizer 023. In this way, the circular polarizer 02 may reduce the ambient light 03 exiting from the display assembly, thereby improving contrast of a display assembly which includes the display panel 01.

Figure 3:
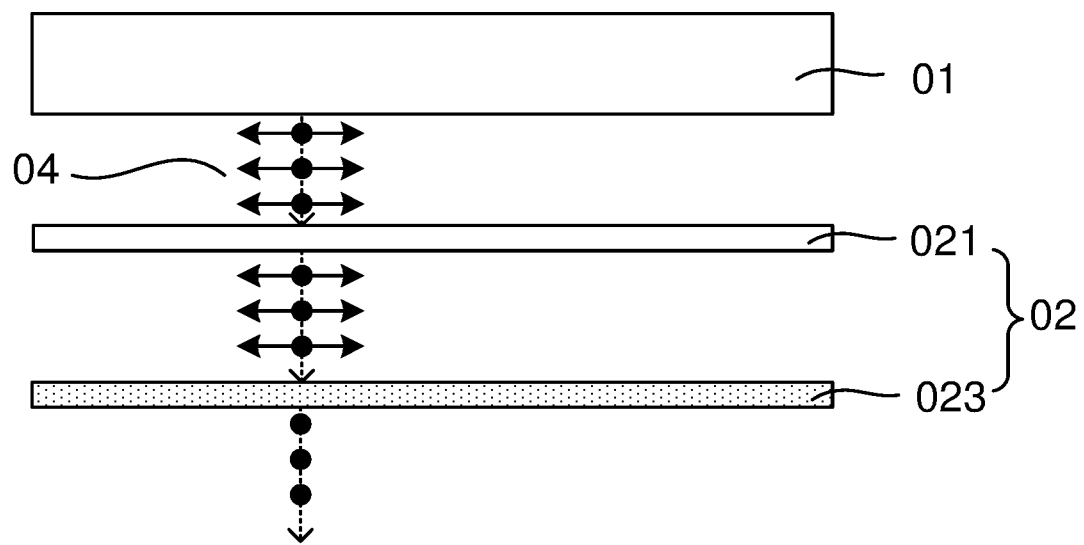
FIG. 3 is a schematic diagram showing how light exits from the display assembly in FIG. 1.

However, as shown in FIG. 3, light 04 emitted by the display panel 01 is also natural light which is still natural light after passing through the quarter-wave plate 021. That is to say, after passing through the quarter-wave plate 021, the light 04 can still be resolved into linearly polarized light with two polarization directions perpendicular to each other. For example, as shown in FIG. 3, the light 04 is resolved into linearly polarized light with a polarization direction perpendicular to the paper (represented by the dot) and linearly polarized light with a polarization direction parallel to the paper (represented by the line segment with arrows at both ends). Since linearly polarized light with the polarization direction perpendicular to the polarization axis of the absorbing polarizer 023 is not able to pass through the absorbing polarizer 023 and the linearly polarized light with the polarization direction parallel to the polarization axis of the absorbing polarizer 023 is able to pass through the absorbing polarizer 023, approximately half of the light 04 emitted by the display panel 01 is able to pass through the circular polarizer 02, which decreases light existing from the display assembly.

Some embodiments of the present disclosure provide a display assembly 100. Referring to FIGS. 4, 6, 7 and 8, the display assembly 100 includes a display panel 1 and at least one optical film group 2, and each optical film group 2 is disposed on a display surface S1 (or a display surface S2) of the display panel 1. The display panel 1 includes a plurality of sub-pixels P. The display panel may further include a substrate 11 on which the plurality of sub-pixels P are disposed.

In some examples, the display panel 1 is an OLED display panel, and each sub-pixel includes, for example, a light-emitting device 13 and a driver circuit 12 electrically connected to the light-emitting device 13. In some other examples, the display panel 1 is a display panel of another type, for example, a micro light-emitting display (Micro LED) panel, or a liquid crystal display (LCD) panel.

The optical film group 2 includes a quarter-wave plate 21, a reflective polarizer 22 and an absorbing polarizer 23 sequentially arranged in a direction away from the display panel 1.

The reflective polarizer 22 includes a reflective portion 221. The reflective portion 221 is capable of allowing light with a polarization direction parallel to a polarization axis of the reflective polarizer 22 to pass through and reflecting light with a polarization direction perpendicular to the polarization axis of the reflective polarizer 22. An orthographic projection of an effective light-emitting area A of at least one sub-pixel (for example, an effective light-emitting area of a light-emitting device in a sub-pixel of an OLED display panel) on a plane parallel to the display surface S1 of the display panel 1 is substantially within an orthographic projection of the reflective portion 221 on the plane. The plane overlaps with, for example, the surface of the substrate 11 facing the plurality of sub-pixels P. The following embodiments are described by taking an example in which the plane overlaps with this surface of the substrate 11.

The absorbing polarizer 23 is capable of allowing light with a polarization direction parallel to a polarization axis of the absorbing polarizer 23 to pass through and absorbing light with a polarization direction perpendicular to the polarization axis of the absorbing polarizer 23. The polarization axis of the reflective polarizer 22 is parallel to the polarization axis of the absorbing polarizer 23.

The following embodiments are described by taking the display panel 1 being the OLED display panel as an example, and the display panel of another type may refer to the description related to the OLED display panel.

Figure 4:
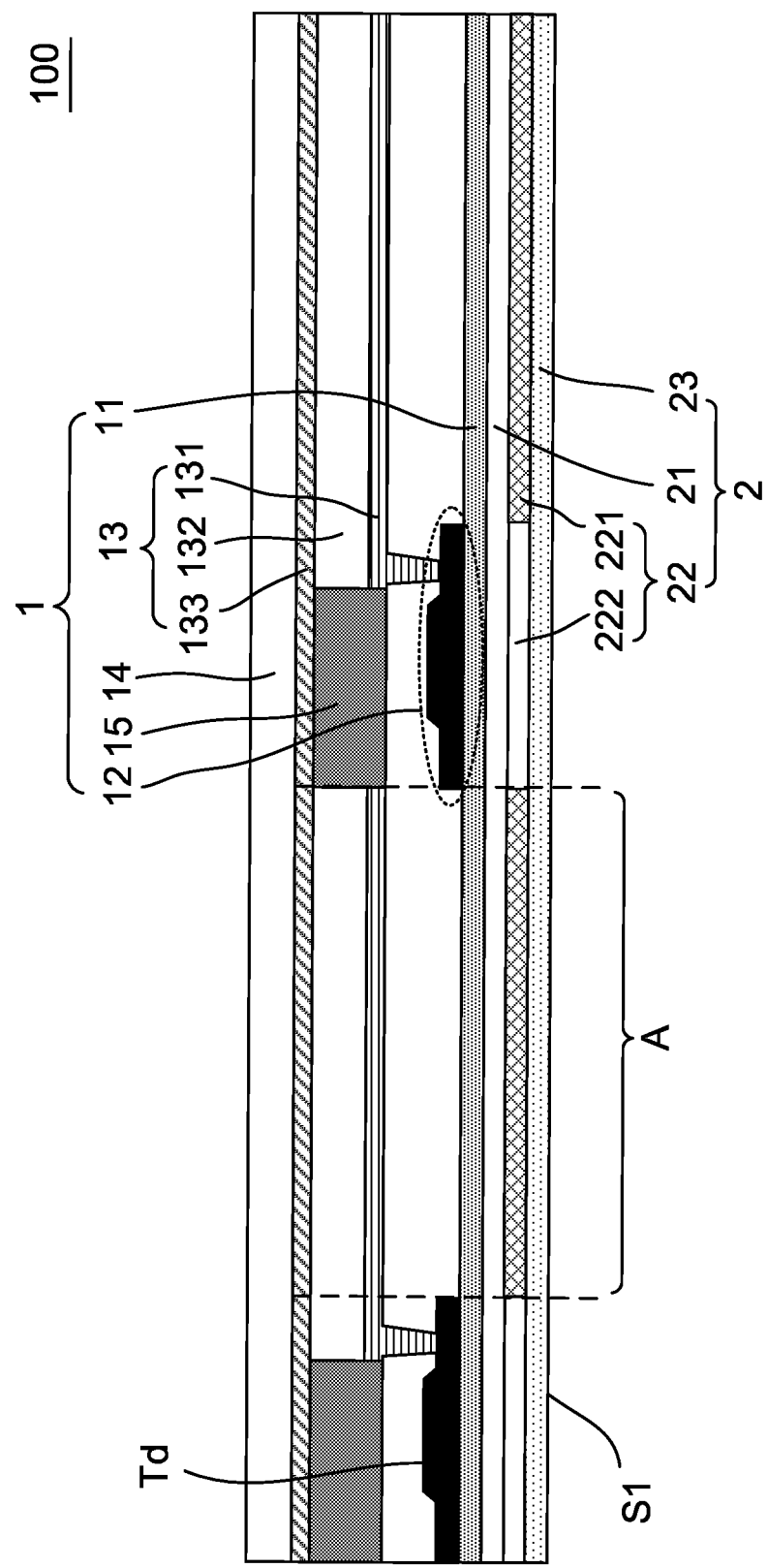
FIG. 4 is a section of part of a display assembly, in accordance with some embodiments.

For example, referring to FIG. 4, the light-emitting device 13 includes a first electrode 131 and a second electrode 133, and a light-emitting functional layer 132 disposed between the first electrode 131 and the second electrode 133. The light-emitting functional layer 132 may be a single-layer structure including an organic emission layer or a multiple-layer structure including an organic emission layer. For example, in addition to the organic emission layer, the light-emitting functional layer 132 includes at least one of an electron transporting layer (ETL), an electron injection layer (EIL), a hole transporting layer (HTL) and a hole injection layer (HIL). The light-emitting functional layer 132 may be formed by ink-jet printing or evaporation. The first electrode 131 of the light-emitting device 13 may be an anode and the second electrode 133 may be a cathode. Or, the first electrode 131 of the light-emitting device 13 may be a cathode and the second electrode 133 may be an anode.

The effective light-emitting area A of the sub-pixel refers to an area actually used for image display in the sub-pixel during display. For example, during the display of the display panel 1, the whole light-emitting functional layer 132 is used for emitting light, but an orthographic projection of a portion of the light-emitting functional layer 132 on the substrate 11 may overlap with an orthographic projection of the driver circuit 12 (which is non-transparent) on the substrate 11, which means that light emitted from this portion of the light-emitting functional layer 132 is blocked by the driver circuit 12 and thus is hardly observed. Therefore, although this portion of the light-emitting functional layer 132 emits light, it does not make a contribution to the image display, and this portion is not included in the effective light-emitting area A of the light-emitting device 13.

In addition, the display surface S1 of the display panel 1 refers to a surface of the display panel 1 through which a user can watch the image displayed by the display panel 1. In an example where the display panel 1 is the OLED display panel, the display panel 1 may be a display panel capable of emitting light from one side, for example, a top-emitting display panel (shown in FIG. 7) or a bottom-emitting display panel (shown in FIG. 4). The display panel 1 may also be a double-sided light-emitting display panel (shown in FIG. 8), that is, a display panel capable of emitting light from two sides, and both sides of the display panel 1 can display images.

Figure 5A:
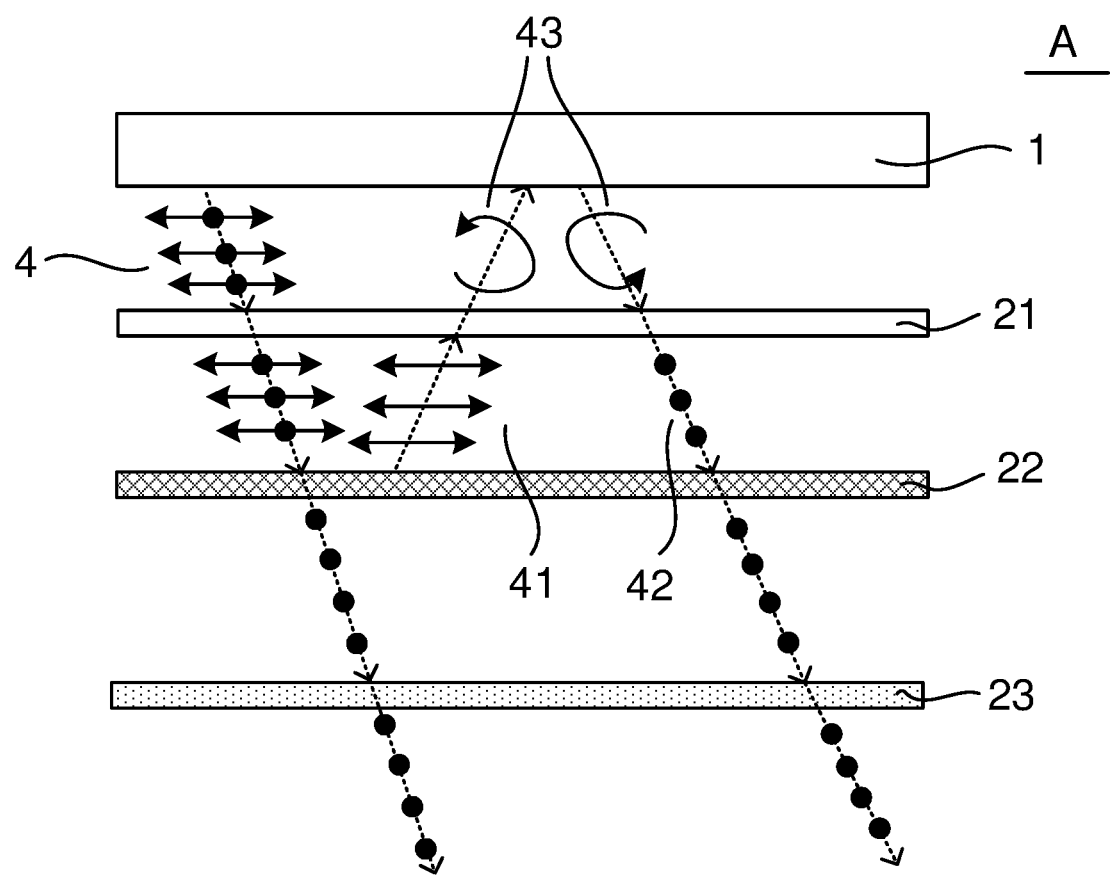
FIG. 5A is a schematic diagram showing how light exits from the display device in FIG. 4.

Referring to FIG. 5A, light 4 emitted from the effective light-emitting area A of the sub-pixel is natural light, and the light 4 is still natural light after passing through the quarter-wave plate 21, which may be resolved into linearly polarized light with two polarization directions perpendicular to each other. The linearly polarized light with the polarization direction parallel to the polarization axis of the reflective polarizer 22 is able to pass through the reflective polarizer 22. The linearly polarized light with the polarization direction perpendicular to the polarization axis of the reflective polarizer 22 is not able to pass through the reflective polarizer 22, and is reflected by the reflective polarizer 22. Herein, the linearly polarized light reflected by the reflective polarizer 22 is called first linearly polarized light 41. The first linearly polarized light 41 passes through the quarter-wave plate 21 and becomes circularly polarized light 43. The circularly polarized light 43 is reflected by the display panel 1, and becomes second linearly polarized light 42 after passing through the quarter-wave plate 21. There is a 90° difference between a polarization direction of the second linearly polarized light 42 and a polarization direction of the first linearly polarized light 41. In this way, the second linearly polarized light 42 is able to pass through the reflective polarizer 22 and the absorbing polarizer 23 whose polarization axis is parallel to the polarization axis of the reflective polarizer 22, thereby increasing light exiting from the display assembly 100 and improving contrast of the display assembly 100.

The reflective polarizer 22 may have various structures. For example, the reflective polarizer 22 may include a polarizer (such as an absorbing polarizer) and reflective films attached to two opposite surfaces of the polarizer respectively. On a basis of a principle of polarization that linearly polarized light with a polarization direction consistent with a direction of a polarization axis of a polarizer is able to pass through the polarizer, and linearly polarized light with a polarization direction perpendicular to the direction of the polarization axis of the polarizer is not able to pass through the polarizer, linearly polarized light which is not able to pass through the polarizer may be reflected by one of the reflective films.

Figure 14:
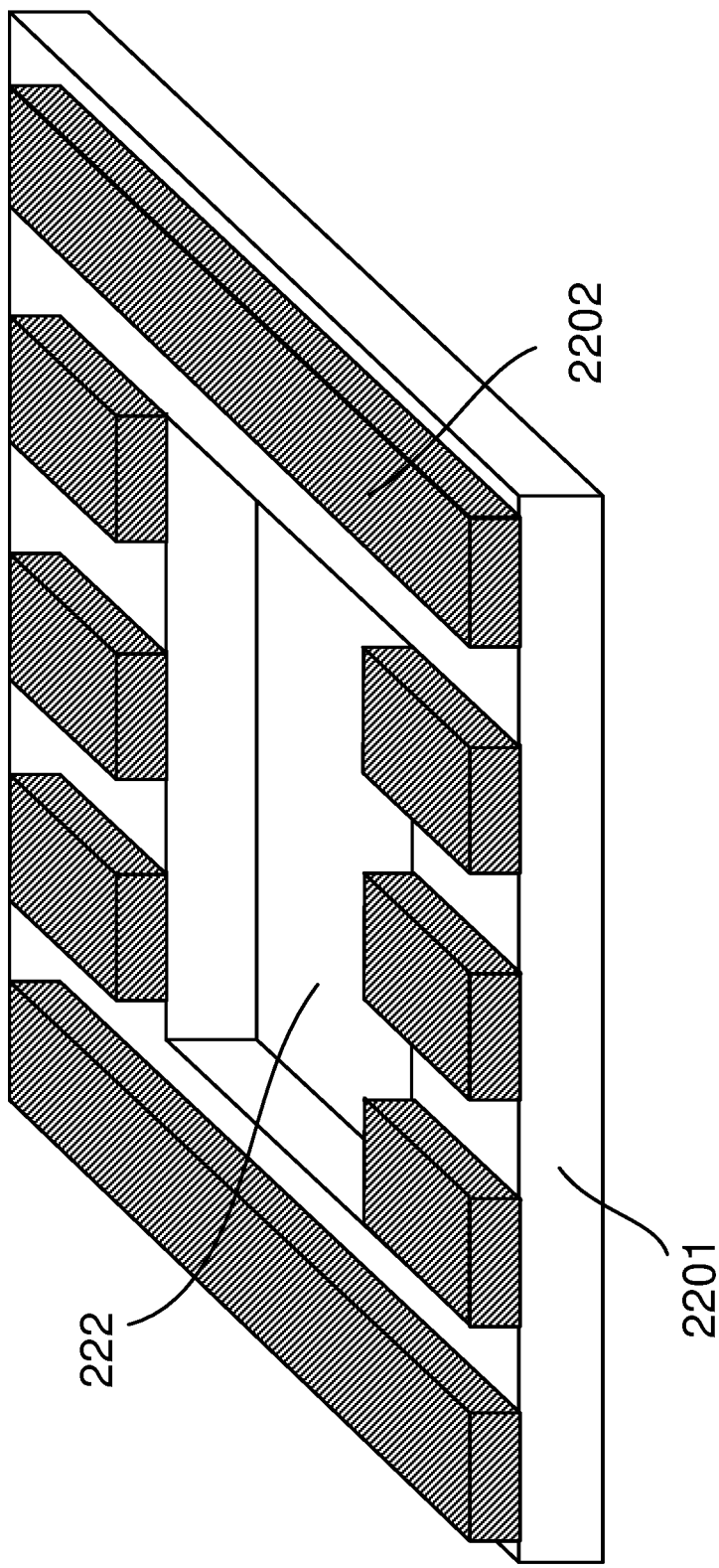
FIG. 14 is a perspective view of part of a reflective polarizer, in accordance with some embodiments.
Figure 15:
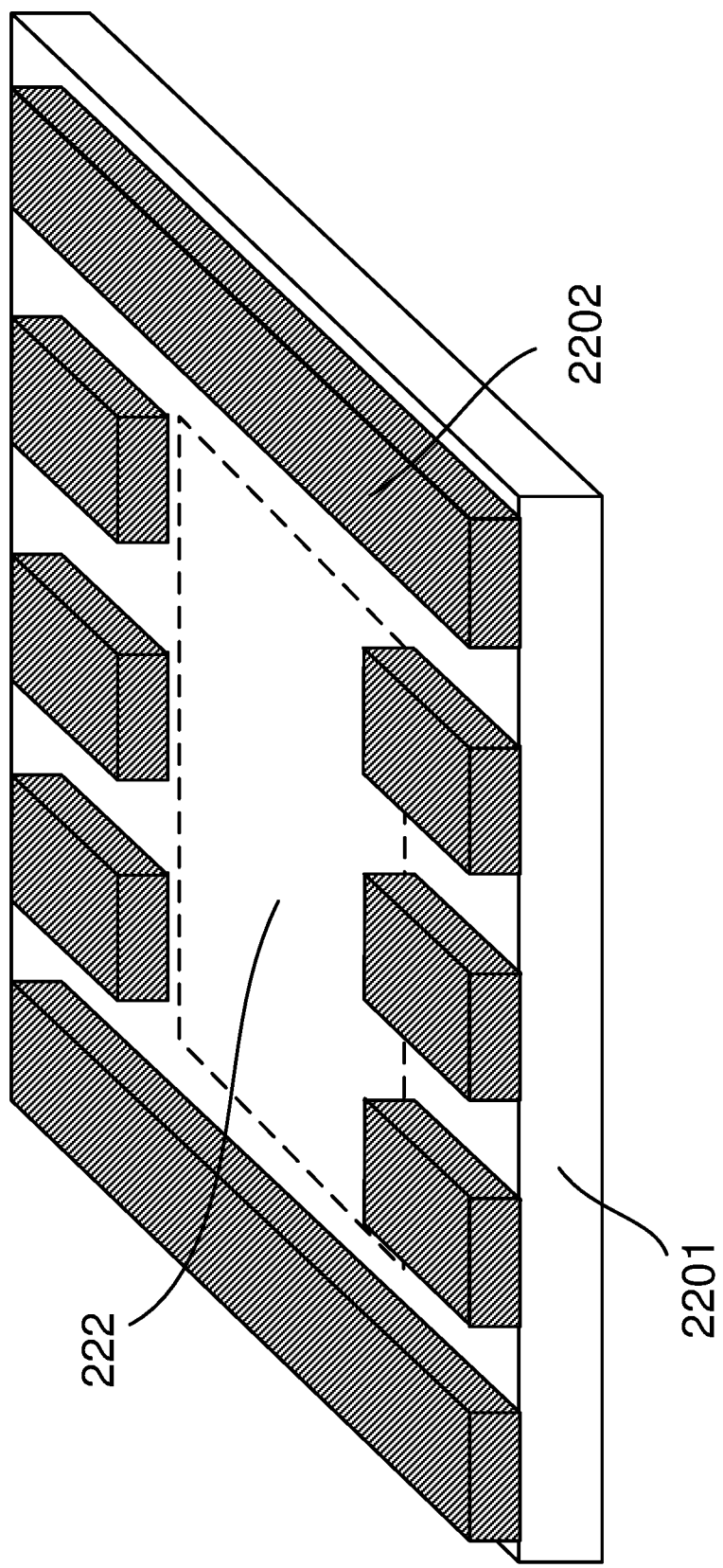
FIG. 15 is a perspective view of part of another reflective polarizer, in accordance with some embodiments.

In some embodiments, as shown in FIGS. 14 and 15, the reflective polarizer 22 is a wire-gird polarizer. The wire-gird polarizer includes a plurality of metal wires 2202 which are arranged at equal intervals. Surfaces of the metal wires 2202 can reflect light, so that the wire-gird polarizer can reflect linearly polarized light which can not pass through the wire-gird polarizer.

It will be noted that a polarization axis of the wire-gird polarizer is perpendicular to an extension direction of the metal wires 2202. For example, in a case where the natural light is resolved into linearly polarized light with a polarization direction parallel to the extension direction of the metal wires 2202 and linearly polarized light with a polarization direction perpendicular to the extension direction of the metal wires 2202, the linearly polarized light with the polarization direction parallel to the extension direction of the metal wires 2202 is able to pass through the wire-gird polarizer. The linearly polarized light with the polarization direction perpendicular to the extension direction of the metal wires 2202 is not able to pass through the wire-gird polarizer, and is reflected by the surface of the wire-gird polarizer.

For example, a width of each metal wire 2202 is in a range from 50 nm to 60 nm, and a fill factor of the wire-gird polarizer is in a range from 0.4 to 0.6. For example, a width of each metal wire 2202 may be 50 nm, 52 nm, 55 nm, 58 nm or 60 nm, and the fill factor of the wire-gird polarizer may be 0.4, 0.45, 0.5, 0.55 or 0.6. In this way, the light emitted from the display assembly 100 may be further increased, and the original linearly polarized light with two directions perpendicular to each other may be emitted from the display assembly 100. The fill factor of the wire-gird polarizer equals to an area ratio of the metal wires to the wire-gird polarizer. For example, the width of each metal wire 2202 is 50 nm, an interval between two adjacent metal wires 2202 is 50 nm, and the fill factor is approximately 0.5. For another example, the width of each metal wire 2202 is 50 nm, the interval between two adjacent metal wires 2202 is 75 nm, and the fill factor is approximately 0.4.

The display panel 1 may have various structures.

Figure 6:
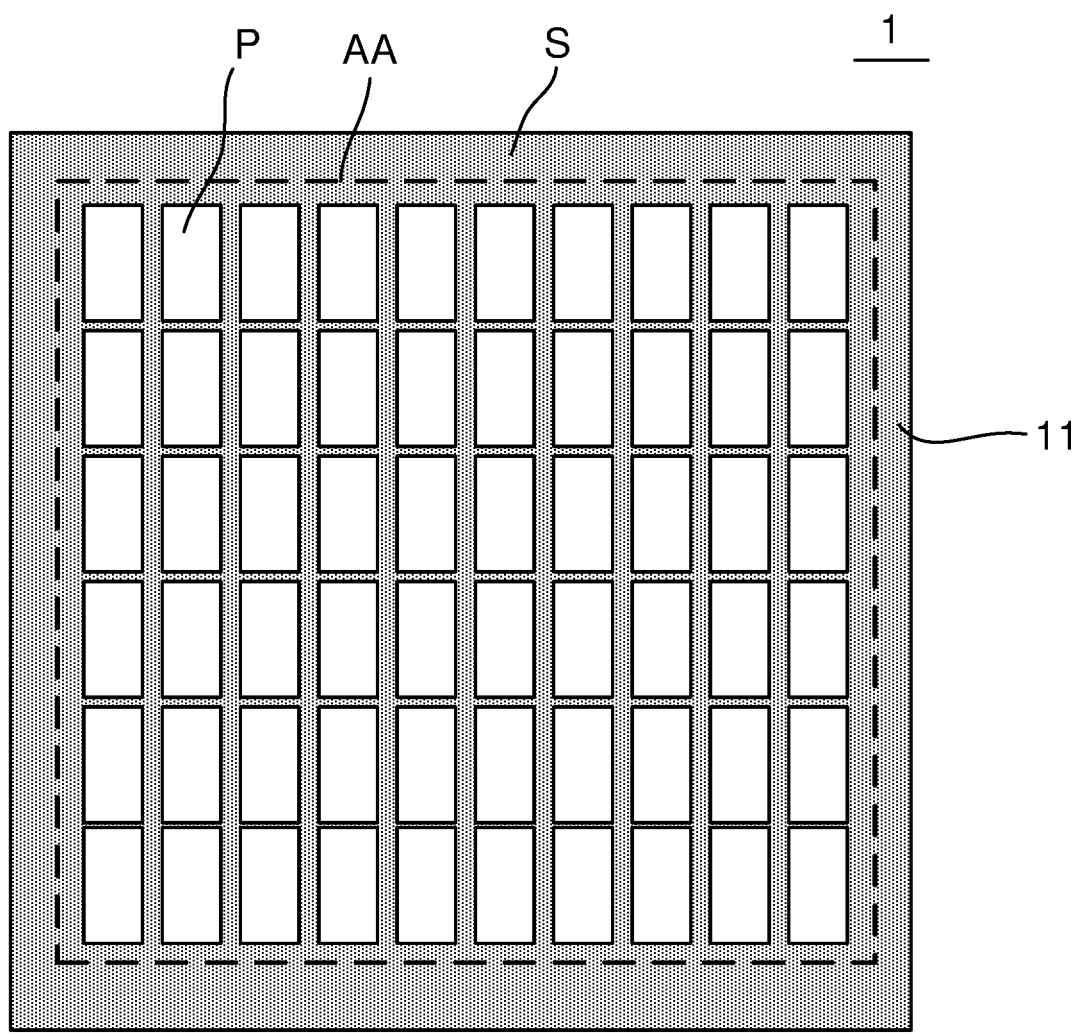
FIG. 6 is a top view of a display panel, in accordance with some embodiments.

For example, referring to FIGS. 4 and 6, the display panel 1 is the OLED display panel, the first electrode 131 of the light-emitting device 13 is an anode, and the second electrode 133 of the light-emitting device 13 is a cathode. As shown in FIG. 6, the display panel 1 has an active area AA used for display and a peripheral region S disposed around the active area AA. The plurality of sub-pixels P are located in the active area AA. The peripheral region S may be used for arranging wires and circuits, for example, a gate driver circuit.

Each sub-pixel P includes the driver circuit 12 and the light-emitting device 13. The driver circuit 12 may include a plurality of thin film transistors including a driving transistor Td. FIG. 4 is a section of part of the display panel 100 taken along a line passing through the driving transistor Td. FIG. 4 only shows the driving transistor Td, and does not show other thin film transistors. With regard to the structure of the other thin film transistors, reference may be made to the structure of the driving transistor Td.

The display panel 1 includes a plurality of metal layers, for example, a source and drain metal layer (including a source and a drain of each thin film transistor) and a gate metal layer (including a gate of each thin film transistor and a gate line electrically connected to the gate). Taking the driving transistor Td as an example, the driving transistor Td includes a gate, a source and a drain, and the source or the drain is electrically connected to the first electrode 131 of the light-emitting device 13.

As shown in FIG. 4, the display panel 1 may further include a pixel defining layer 15 and an encapsulation layer 14 that is disposed on a side of the second electrode 133 away from the substrate 11. The pixel defining layer 15 includes a plurality of openings, and a light-emitting functional layer 132 of a light-emitting device 13 is disposed in each opening. The encapsulation layer 14 may be used to prevent water and oxygen from reaching and entering the light-emitting device 13.

In some embodiments, the display panel 1 may be a top-emitting display panel, a bottom-emitting display panel or a double-sided light-emitting display panel according to different light-emitting directions. Display panels 1 with different light-emitting directions will be described exemplarily with reference to FIGS. 4, 7 and 8.

In some embodiments, as shown in FIG. 4, the display panel 1 is the bottom-emitting display panel. The display panel 1 has a display surface S1 located on a side of the driver circuits 12 away from the light-emitting devices 13.

In this display panel 1, the first electrode 131 is transparent. For example, the first electrode 131 is made of indium tin oxide (ITO), indium zinc oxide (IZO), zinc oxide (ZnO), indium oxide ($In_2O_3$) or the like. The second electrode 133 is opaque. For example, the second electrode 133 is made of silver or aluminum.

For example, the optical film group 2 is disposed on a surface of the substrate 11 facing away from the encapsulation layer 14. The quarter-wave plate 21 is in contact with a surface of the substrate 11 facing away from the plurality of sub-pixels (i.e., a surface of the substrate 11 facing away from each driver circuit 12 and each light-emitting device 13). The reflective polarizer 22 is in contact with a surface of the quarter-wave plate 21 facing away from the substrate 11, and the absorbing polarizer 23 is in contact with a surface of the reflective polarizer 22 facing away from the quarter-wave plate 21. Here, a transparent optical glue may be used to attach one to another of the above components to implement the contact.

Referring to FIG. 4, in some embodiments, the reflective polarizer 22 of the display panel 1 further includes a plurality of light-transmissive portions 222. The light-transmissive portions 222 are capable of allowing light with two polarization directions perpendicular to each other to pass through. An orthographic projection of non-light-emitting area (such as an area occupied by a driver circuit 12) of each sub-pixel on the substrate 11 is substantially within an orthographic projection of a respective one of the plurality of light-transmissive portions 222 on the substrate 11.

In some embodiments, the plurality of light-transmissive portions 222 include at least one transparent portion and/or at least one opening. For example, the plurality of light-transmissive portions 222 include a plurality of transparent portions. For another example, the plurality of light-transmissive portions 222 include a plurality of openings. For another example, the plurality of light-transmissive portions 222 include at least one transparent portion and at least one opening. For example, the transparent portion serving as the light-transmissive portion 222 is made of a transparent material. For another example, the opening serving as the light-transmissive portion may be formed by removing a corresponding portion in the reflective polarizer 22.

In some embodiments, the orthographic projection of the reflective portion 221 on the substrate 11 substantially coincides with orthographic projections of the effective light-emitting areas A of the effective light-emitting areas (such as, the effective light-emitting area of the light-emitting devices 13) of the plurality of sub-pixels on the substrate 11.

Figure 5B:
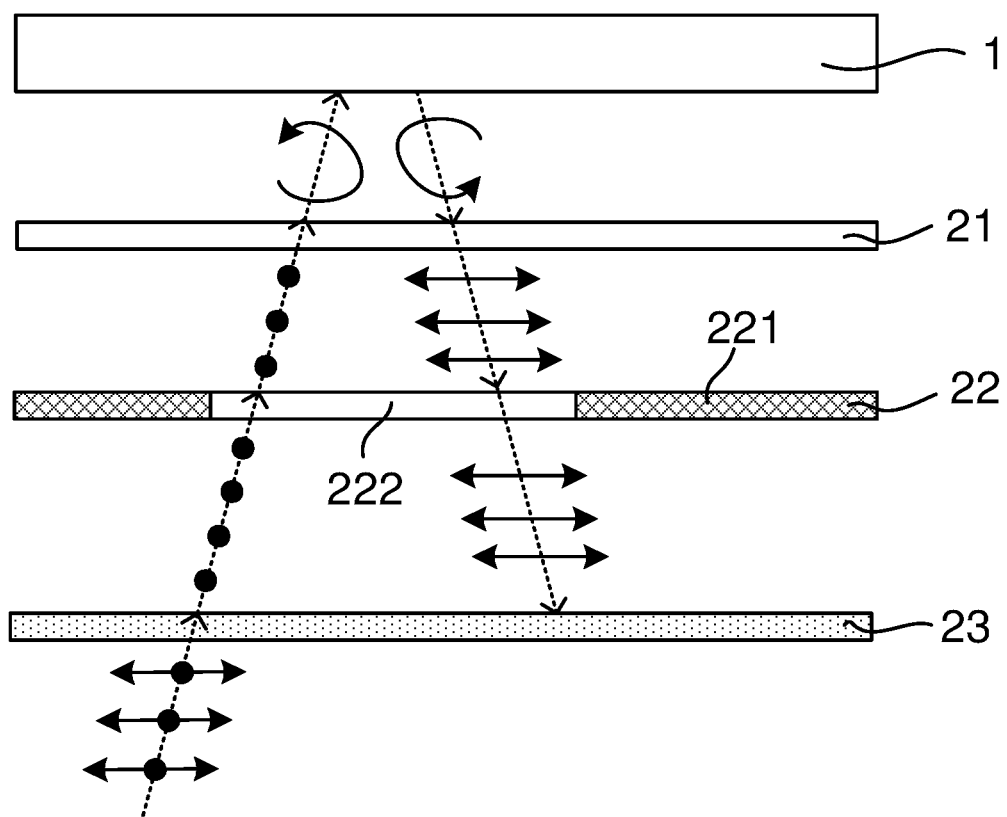
FIG. 5B is a schematic diagram showing how the display assembly in FIG. 4 prevents ambient light from being reflected.

It will be noted that in the bottom-emitting display panel, the driver circuit 12 in each sub-pixel is closer to the display surface S1 relative to the light-emitting device 13. A part of the linearly polarized light of the ambient light passes through the absorbing polarizer 23, reaches the driver circuit 12 and is reflected by the driver circuit 12. As shown in FIG. 5B, the part which reaches the driver circuit 12 and is reflected by the driver circuit 12 passes through the plurality of light-transmissive portions 222 and reaches the absorbing polarizer 23, and then is absorbed by the absorbing polarizer 23. As a result, this part will not be reflected to the display panel 1 by the reflective portion 221, which may prevent the driver circuit 12 from reflecting the ambient light, i.e., a reflection of the display panel 1 to the ambient light may be reduced, thereby improving the contrast of the display assembly 100. Besides, the reflective portion 221 of the reflective polarizer 22 may increase the light emitted from the display assembly 100.

On this basis, the reflective polarizer 22 may be a wire-gird polarizer. For example, referring to FIGS. 9 and 14, the reflective polarizer 22 includes a transparent base 2201 and metal wires 2202 disposed on the transparent base 2201. The quarter-wave plate 21 is disposed on surfaces of the metal wires 2202 facing away from the transparent base 2201, and the absorbing polarizer 23 is disposed on a side of the transparent base 2201 away from the metal wires 2202.

For example, referring to FIG. 14, by removing multiple portions of the transparent base 2201 and the metal wires 2202, the openings which serving as the light-transmissive portions 222 are formed.

For another example, referring to FIG. 15, since the transparent base 2201 is transparent, by only removing multiple portions of the metal wires 2202, the transparent portions which serve as the light-transmissive portion 222 are formed. The transparent portion corresponds to a portion on which no metal wires of the transparent base 2201 are located. In this case, a portion on which metal wires 2202 are located of the transparent base 2201 and the metal wires 2202 thereon jointly serve as the reflective portion 221 of the reflective polarizer 22.

Figure 7:
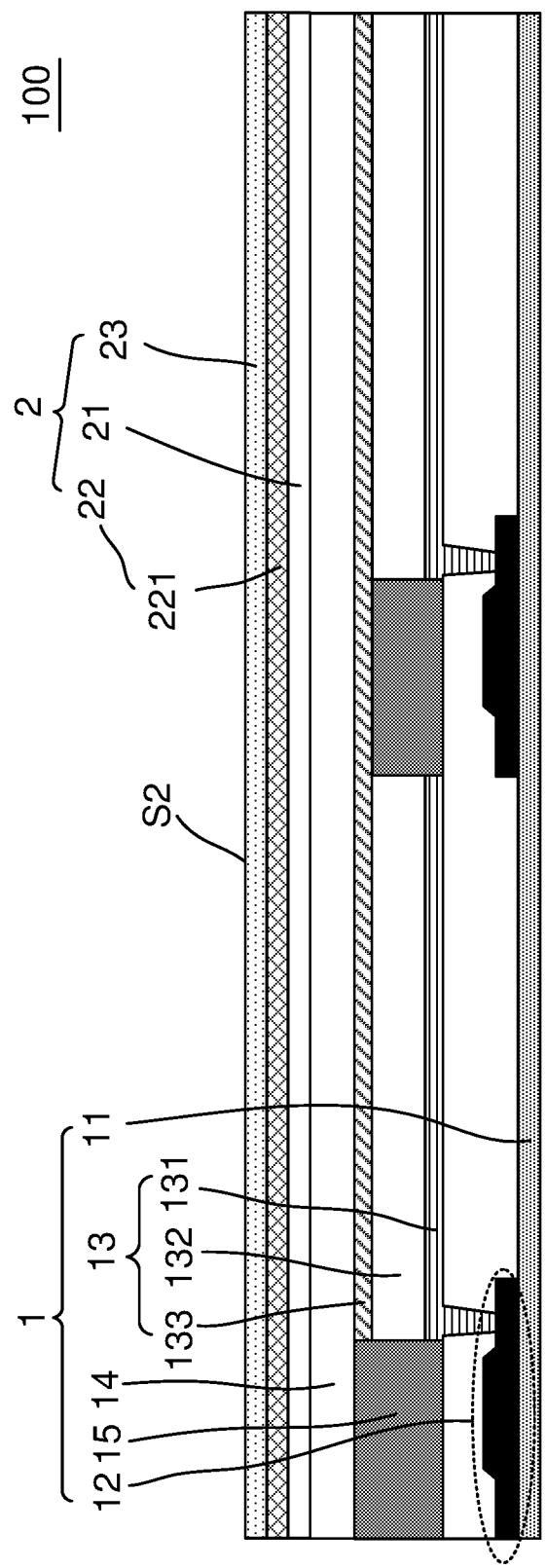
FIG. 7 is a section of part of another display assembly, in accordance with some embodiments.

In some embodiments, as shown in FIG. 7, the display panel 1 is the top-emitting display panel. The display panel 1 has a display surface S2 which is located on a surface of a layer including the driver circuits 12 proximate to the light-emitting devices 13.

In the display panel 1, the first electrode 131 is opaque. The first electrode 131 may be a multiple-layer structure composed of at least one ITO (Indium Tin Oxides) layer and at least one silver (Ag) layer. For example, the first electrode 131 is a three-layer structure composed of an ITO layer, an Ag layer and an ITO layer that are stacked. The second electrode 133 is transparent or translucent, for example, the second electrode 133 is composed of a silver layer that is thin enough to be transparent or translucent.

The at least one optical film group 2 includes one optical film group 2, which is disposed on a side of the encapsulation layer 14 away from the substrate 11. The quarter-wave plate 21 is disposed on a side of the plurality of sub-pixels away from the substrate 11. For example, the quarter-wave plate 21 may be in contact with a surface of the encapsulation layer 14 facing away from the substrate 11, the reflective polarizer 22 is in contact with a surface of the quarter-wave plate 21 facing away from the plurality of sub-pixels, and the absorbing polarizer 23 is in contact with a surface of the reflective polarizer 22 facing away from the quarter-wave plate 21.

On this basis, in some embodiments, orthographic projections of non-light-emitting areas (such as, the areas occupied by the driver circuits 12) of the plurality of sub-pixels on the substrate 11 are within the orthographic projection of the reflective portion 221 of the reflective polarizer 22 on the substrate 11.

For example, as shown in FIGS. 6 and 7, the reflective portion 221 covers the entire active area AA of the display panel 1. In this case, the reflective portion 221 may have a structure of a complete plate.

It will be noted that in a case where the display panel 1 is the top-emitting display panel, the light-emitting device 13 in each sub-pixel is closer to the display surface S2 relative to the driver circuit 12. The linearly polarized light of the ambient light passing through the absorbing polarizer 23 first reaches the light-emitting device 13. Since the first electrode 131 of the light-emitting device 13 is opaque, the linearly polarized light from the ambient light and passing through the absorbing polarizer 23 will not reach the driver circuit 12, that is to say, a problem that the driver circuit 12 reflects the ambient light hardly occurs in each sub-pixel. In this case, the reflective portion 221 of the reflective polarizer 22 may cover the entire active area AA, and the light emitted from the display assembly 100 may be increased while the contrast of the display assembly 100 may be ensured.

On this basis, the reflective polarizer 22 may be a wire-gird polarizer (shown as FIG. 14) which includes a transparent base 2201 and metal wires 2202 disposed on the transparent base 2201. In this case, the quarter-wave plate 21 may be disposed on surfaces of the metal wires 2202 facing away from the transparent base 2201, and the absorbing polarizer 23 may be disposed on a surface of the transparent base 2201 facing away from the metal wires 2202.

Figure 8:
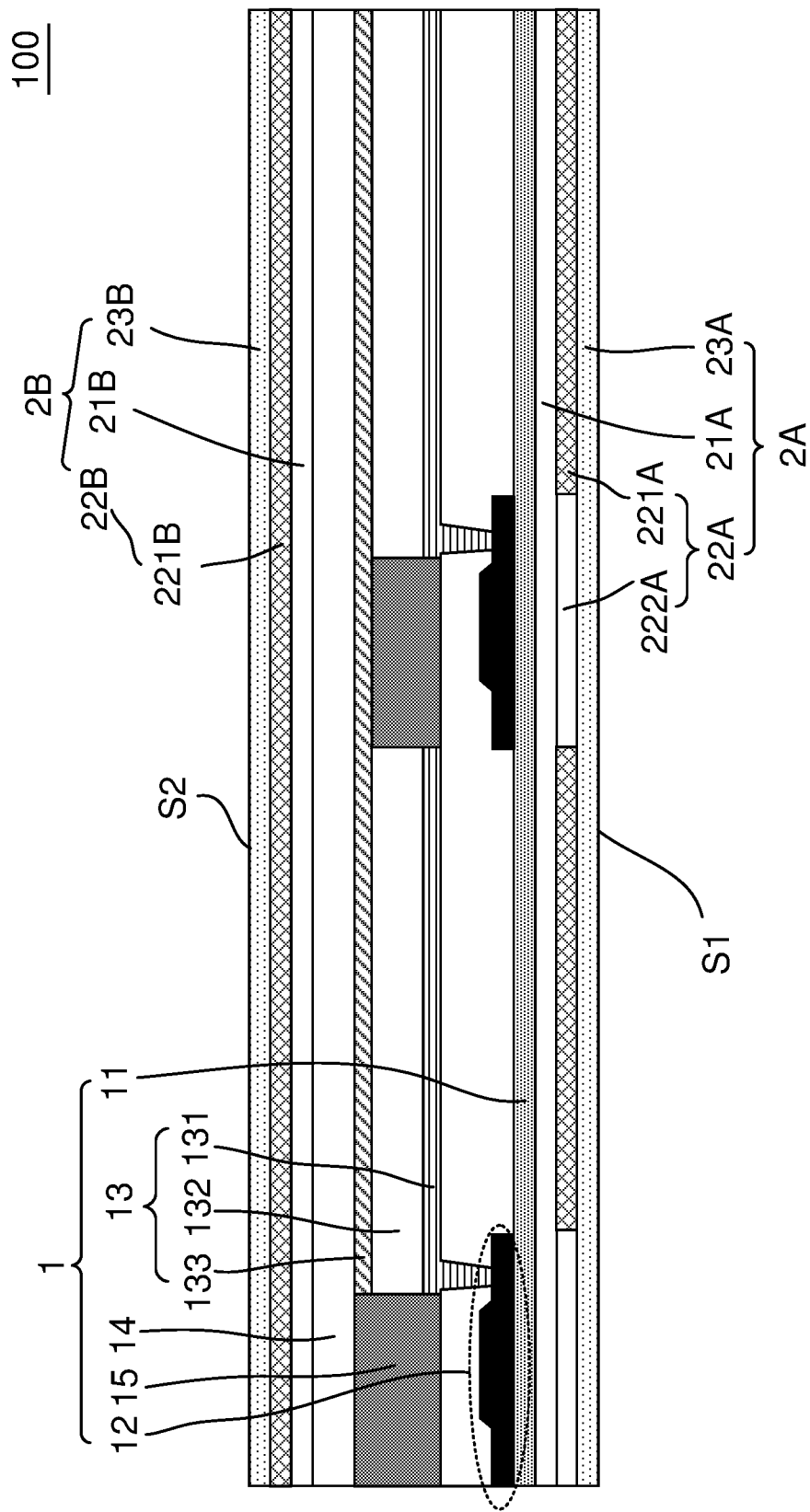
FIG. 8 is a schematic section of part of yet another display assembly, in accordance with some embodiments.

In some embodiments, as shown in FIG. 8, the display panel 1 is the double-sided light-emitting display panel, and the display panel 1 has two display surfaces, i.e., a display surface S1 and a display surface S2. The display surface S1 is located on a side of the driver circuits 12 away from the light-emitting devices 13 and the display surface S2 is located on a side of the driver circuits 12 proximate to the light-emitting devices 13.

In the display panel 1, the first electrode 131 and the second electrode 133 are both transparent. For example, the first electrode 131 is made of indium tin oxide (ITO), indium zinc oxide (IZO), zinc oxide (ZnO), indium oxide ($In_2O_3$) or the like. For example, the second electrode 133 is composed of a silver layer that is thin enough to be transparent or translucent.

The at least one optical film group 2 includes a first optical film group 2A and a second optical film group 2B. The first optical film group 2A is disposed on a side of the substrate 11 away from the plurality of sub-pixels, that is, the display surface S1 of the display panel 1. The second optical film group 2B is disposed on a side of the plurality of sub-pixels away from the substrate 11, that is, the display surface S2 of the display panel 1.

For example, in the first optical film group 2A, the quarter-wave plate 21A is in contact with a surface of the substrate 11 facing away from the plurality of sub-pixels, the reflective polarizer 22A is in contact with a surface of the quarter-wave plate 21A facing away from the substrate 11, and the absorbing polarizer 23A is in contact with a surface of the reflective polarizer 22A facing away from the quarter-wave plate 21A. In the second optical film group 2B, the quarter-wave plate 21B is in contact with a surface of the plurality of sub-pixels facing away from the substrate 11, the reflective polarizer 22B is in contact with a surface of the quarter-wave plate 21B facing away from the plurality of sub-pixels, and the absorbing polarizer 23B is in contact with a surface of the reflective polarizer 22B facing away from the quarter-wave plate 21B.

Referring to FIG. 8, in some embodiments, the reflective polarizer 22A in the first optical film group 2A includes a plurality of light-transmissive portions 222A. An orthographic projection of a non-light-emitting area (such as the area occupied by the driver circuit 12) of each sub-pixel on the substrate 11 is within an orthographic projection of a respective one of the plurality of light-transmissive portion 222A on the substrate 11. Orthographic projections of non-light-emitting areas of the plurality of sub-pixels on the substrate 11 are within an orthographic projection of the reflective portion 221A of the reflective polarizer 22B in the second optical film group 2B on the substrate 11.

On this basis, the reflective polarizers may be wire-gird polarizers. For example, the reflective polarizer 22A in the first optical film group 2A includes a first transparent base and first metal wires disposed on the first transparent base, and the reflective polarizer 22B in the second optical film group 2B includes a second transparent base and second metal wires disposed on the second transparent base.

In the first optical film group 2A, the quarter-wave plate 21A is disposed on surfaces of the first metal wires facing away from the first transparent base, and the absorbing polarizer 22A is disposed on a surface of the first transparent base facing away from the first metal wires. In the second optical film group 2B, the quarter-wave plate 21B is disposed on surfaces of the second metal wires facing away from the second transparent base, and the absorbing polarizer 22B is disposed on a surface of the second transparent base facing away from the second metal wires.

In some embodiments, the optical film group 2 is disposed on a side of the substrate 11 away from the encapsulation layer 14, and a transparent adhesive may be provided onto a surface of the quarter-wave plate 21 facing away from the reflective polarizer 22 to adhere the optical film group 2 to the substrate 11 during the process of manufacturing the display assembly 100.

It will be noted that relative positions of components such as substrate 11, the quarter-wave plate 21, the reflective polarizer 22 and the absorbing polarizer 23 in the display assembly are not be limited to the above description.

Figure 12:
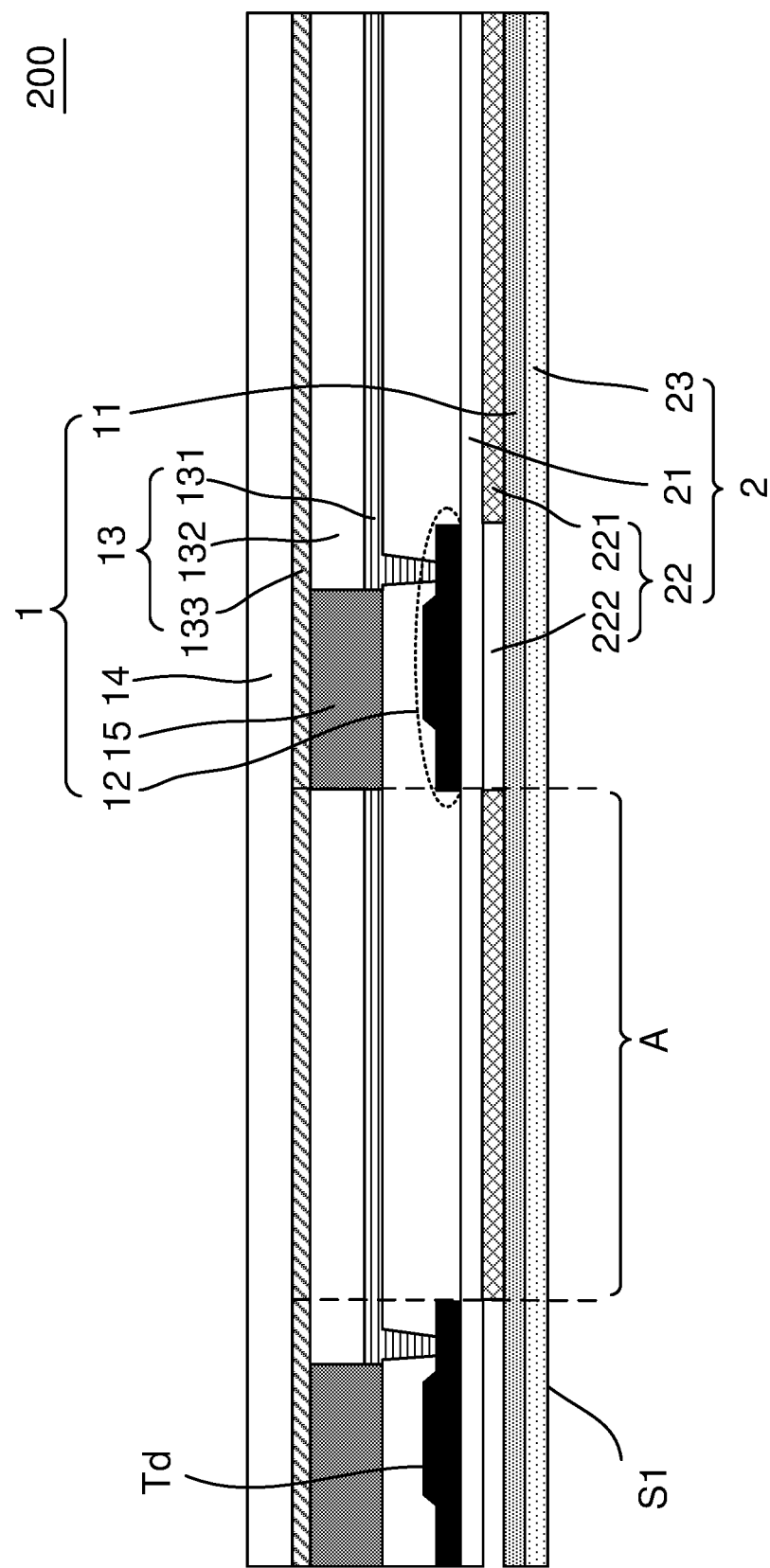
FIG. 12 is a section of part of yet another display assembly, in accordance with some embodiments.
Figure 13:
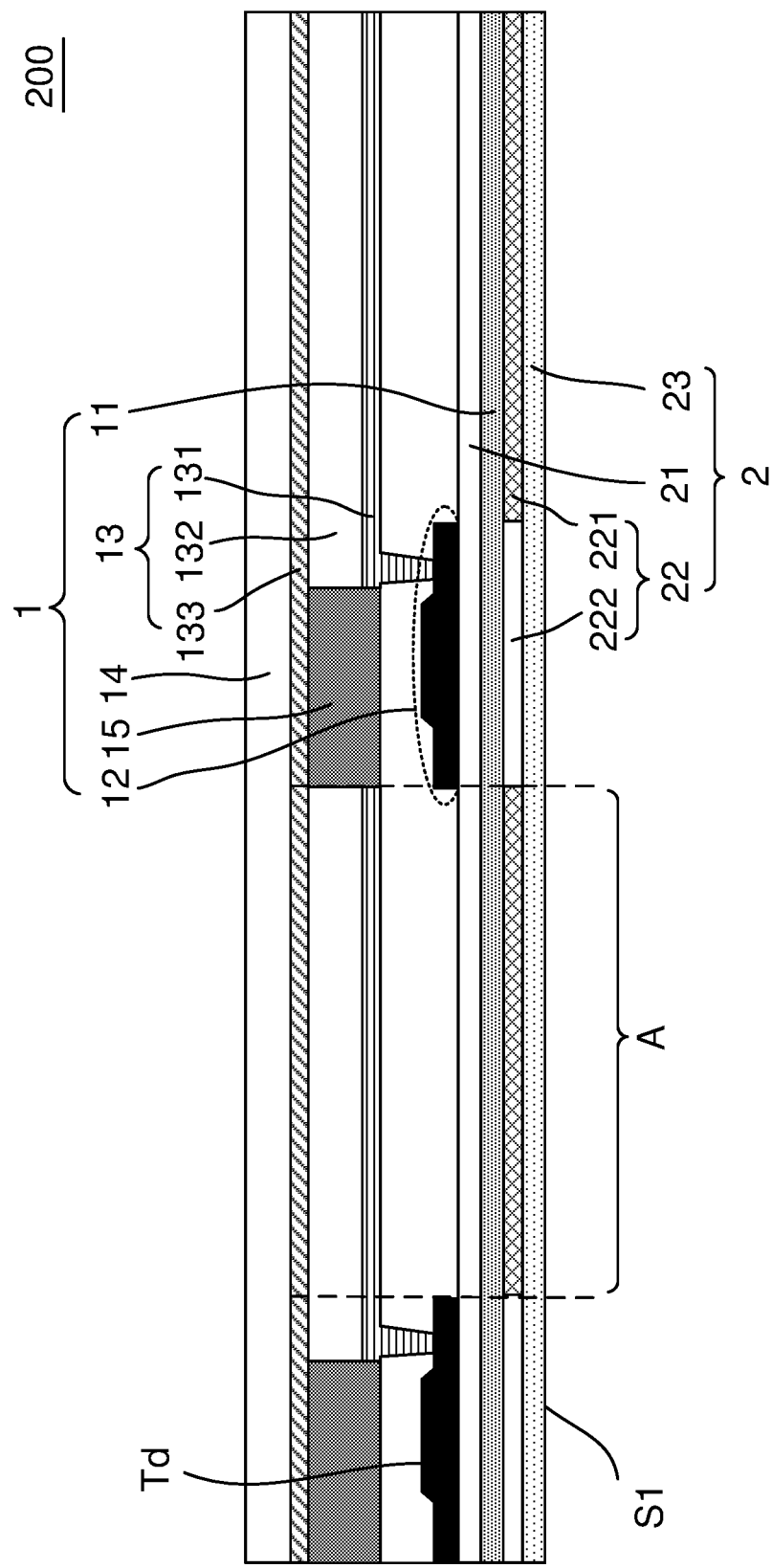
FIG. 13 is a section of part of yet another display assembly, in accordance with some embodiments.

In some embodiments, the display assembly may be the display assembly 200 shown in FIGS. 12 and 13. The display assembly 200 includes a substrate 11, a plurality of sub-pixels disposed on the substrate 11, a quarter-wave plate 21, a reflective polarizer 22 and an absorbing polarizer 23. Each sub-pixel includes a light-emitting device 13 and a driver circuit 12 electrically connected to the light-emitting device 13. The quarter-wave plate 21 is disposed between the substrate 11 and the plurality of sub-pixels. The absorbing polarizer 23 is disposed on a surface of the substrate 11 facing away from the quarter-wave plate 21. The reflective polarizer 22 is disposed between the quarter-wave plate 21 and the absorbing polarizer 23.

The structure of the display panel 1 in the display assembly 200 may be referred to the description of the display panel 1 in the display assembly 100. In addition, as for components such as the substrate 11, the quarter-wave plate 21, the reflective polarizer 22, the absorbing polarizer 23 in the display assembly 200, reference may be made to the above description of the components in the display assembly 100. Details will not be repeated here again.

It will be noted that, as shown in FIGS. 12 and 13, in a case where the substrate 11 and the plurality of sub-pixels disposed on the substrate 11 are defined as constituent portions of the display panel 1, the optical film group 2 including the quarter-wave plate 21, the reflective polarizer 22 and the absorbing polarizer 23 is integrated with the display panel 1, and the light emitted from the display assembly 200 and the contrast of the display assembly 200 may also be increased.

In addition, a display surface S1 of the display panel 1 in FIG. 12 is located on a side of each driver circuit 12 away from a corresponding light-emitting device 13, that is, the display panel 1 in FIG. 12 is a bottom-emitting display panel. In other embodiments, the display panel 1 may be a top-emitting display panel or a double-sided light-emitting display panel. The quarter-wave plate 21, the reflective polarizer 22 and the absorbing polarizer 23 need to be disposed on the display surface of the display panel 1, and reference may be made to arrangements of the quarter-wave plate 21, the reflective polarizer 22, and the absorbing polarizer 23 in the above display panel 100, and details will not be repeated here again.

On this basis, in some embodiments, referring to FIG. 12, the reflective polarizer 22 is disposed between the quarter-wave plate 21 and the substrate 11.

In this case, for example, as shown in FIG. 12, the reflective polarizer 22 is in contact with a surface of the substrate 11 proximate to the light-emitting device 13, the quarter-wave plate 21 is in contact with a surface of the reflective polarizer 22 away from the substrate 11, and the absorbing polarizer 23 is in contact with a surface of the substrate 11 away from the light-emitting device 13.

During manufacturing, the substrate 11 may serve as a base for the quarter-wave plate 21, the reflective polarizer 22 and the absorbing polarizer 23. In a case where the reflective polarizer 22 is a wire-gird polarizer, metal wires may be formed on the substrate 11, so that a thickness of the display assembly 200 may be reduced. Moreover, since the wire-gird polarizer does not require an additional transparent base, light transmittance of the display assembly 200 may be improved.

In some other embodiments, as shown in FIG. 13, the reflective polarizer 22 is disposed between the substrate 11 and the absorbing polarizer 23.

In this case, for example, as shown in FIG. 12, the quarter-wave plate 21 is in contact with the surface of the substrate 11 proximate to the light-emitting device 13, the reflective polarizer 22 is in contact with the surface of the substrate 11 away from the light-emitting device 13, and the absorbing polarizer 23 is in contact with the surface of the reflective polarizer 22 away from the substrate 11.

When the display assembly 200 is manufactured, the substrate 11 may serve as a base for the quarter-wave plate 21, the reflective polarizer 22 and the absorbing polarizer 23. In a case where the reflective polarizer 22 is a wire-gird polarizer, the thickness of the display assembly 200 may also be reduced, and the light transmittance of the display assembly 200 may be improved.

In addition, an analysis process of converting a polarization state of light, emitted by the light-emitting device 13, by the quarter-wave plate 21, the reflective polarizer 22 and the absorbing polarizer 23 in the display assembly 200, to realize a light emission is similar to that of the optical film group 2 in the display assembly 100, and details will not be repeated here again.

In some embodiments, in the display assembly 200, as shown in FIGS. 14 and 15, the wire-gird polarizer includes a plurality of metal wires 2202 which are arranged at equal intervals. A width range of each metal wire 2202 is from 50 nm to 60 nm, and a fill factor of the wire-gird polarizer is in a range from 0.4 to 0.6. For example, the width of each metal wire 2202 may be 50 nm, 52 nm, 55 nm, 58 nm or 60 nm, and the fill factor of the wire-gird polarizer may be 0.4, 0.45, 0.5, 0.55 or 0.6. In this way, the light output of the display assembly 200 may be further improved, and linearly polarized light with two directions perpendicular to each other may be emitted by the display assembly 200. The fill factor of the wire-gird polarizer equals to an area ratio of the metal wires 2202 to the wire-gird polarizer.

Figure 9:
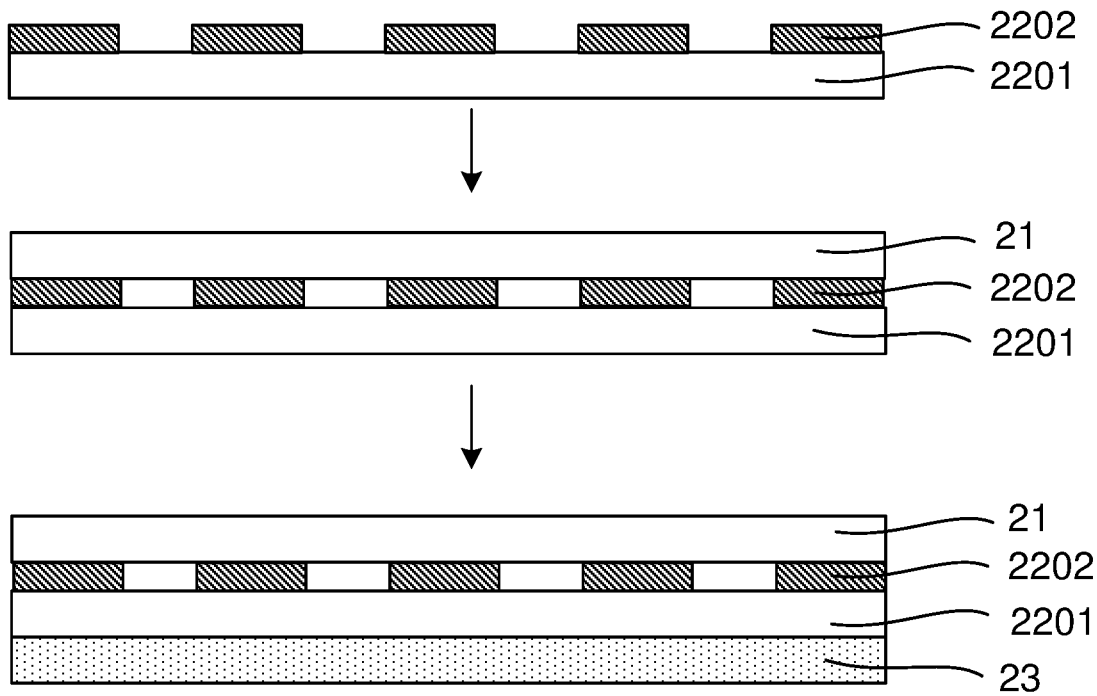
FIG. 9 is a schematic diagram showing steps of manufacturing an optical film group, in accordance with some embodiments.
Figure 10:
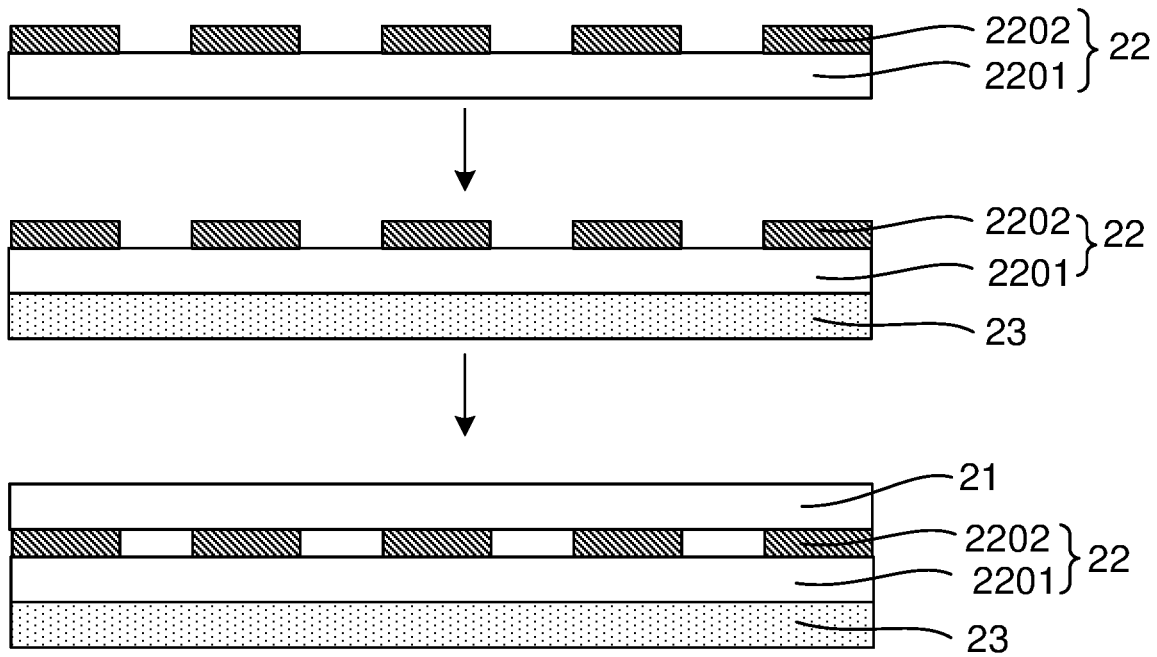
FIG. 10 is a schematic diagram showing steps of manufacturing another optical film group, in accordance with some embodiments.
Figure 11:
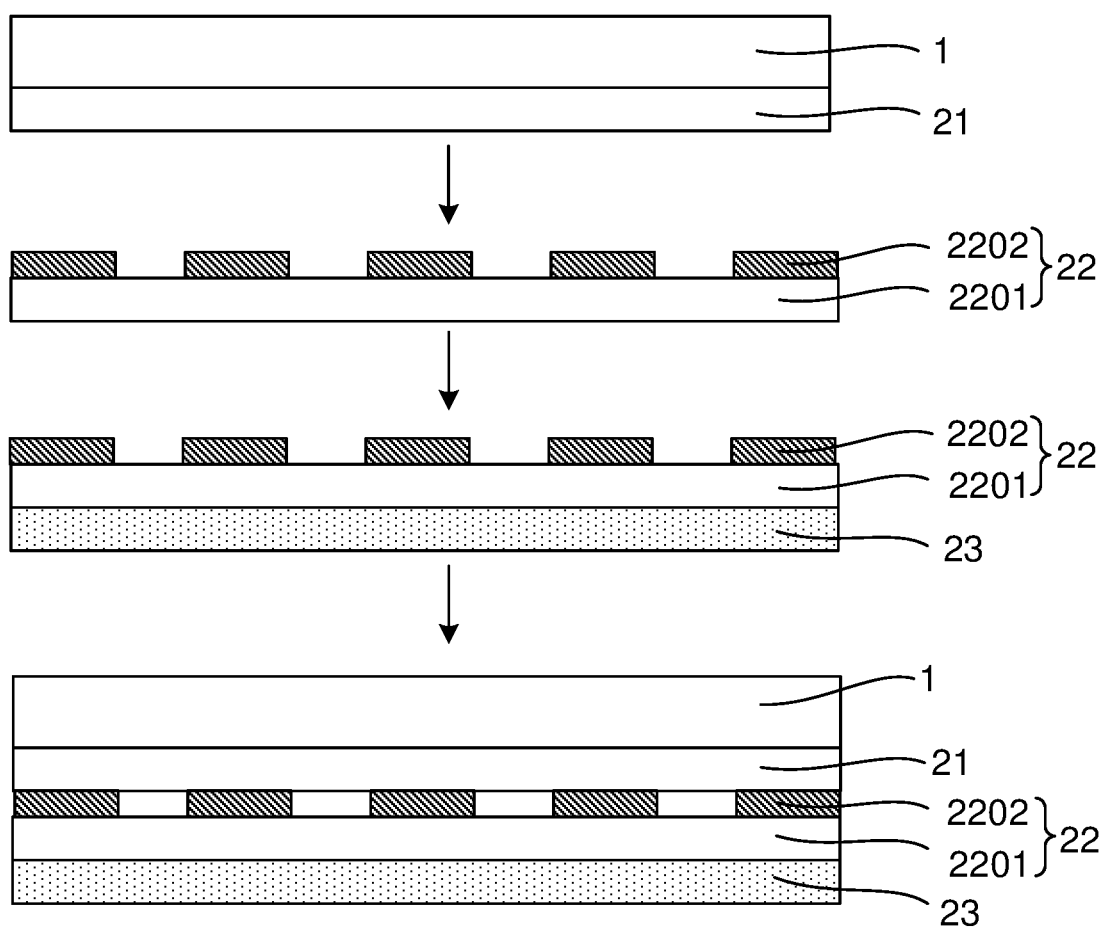
FIG. 11 is a schematic diagram showing steps of manufacturing yet another optical film group, in accordance with some embodiments.

Referring to FIGS. 9 to 11, a method of forming the above wire-gird polarizer will be described exemplarily.

In some embodiments, referring to FIG. 9, the metal wires 2202 are formed on a surface of the transparent base 2201. Then, the quarter-wave plate 21 is attached to surfaces of the metal wires 2202 facing away from the transparent base 2201. Finally, the absorbing polarizer 23 is attached to a surface of the transparent base 2201 facing away from the metal wires 2202.

In other embodiments, as shown in FIG. 10, the metal wires 2202 are first formed on a surface of the transparent base 2201. Then, the absorbing polarizer 23 is attached to another surface of the transparent base 2201 facing away from the metal wires 2202. Finally, the quarter-wave plate 21 is attached to a surface of the metal wires 2202 facing away from the transparent base 2201.

In some other embodiments, as shown in FIG. 11, the quarter-wave plate 21 is attached to the display panel 1 (for example, attached to the substrate 11). The metal wires 2202 is formed on a surface of the transparent base 2201, and the absorbing polarizer 23 is attached to another surface of the transparent base 2201 facing away from the metal wires 2202. Finally, surfaces of the metal wires 2202 facing away from the transparent base 2201 and a surface of the quarter-wave plate 21 facing away from the display panel 1 are attached.

Some embodiments of the present disclosure provide a display device including the display assembly 100 or 200 described above and a driving assembly. The driving assembly is configured to provide display data and control signals to the display assembly 100. For example, the driving assembly may include at least one of a power circuit (Power IC), a timing control circuit (TCON IC), a gray scale circuit, a source driver IC or a gate driver IC. The display device has the same beneficial effects as the display assembly 100, and details will not be repeated here again. The display device provided by some embodiments of the present disclosure may be any product or component having a display function, such as a mobile phone, a tablet computer, a television, a display, a notebook computer, a digital camera, a navigator and the like.

Referring to FIGS. 4, 7 and 8, some embodiments of the present disclosure provide an optical film group, which may be the optical film group 2, 2A, or 2B in the display assembly 100 described above. The optical film group has the same beneficial effects as the display assembly 100, and details will not be repeated here again.

In the description of the foregoing embodiments, specific features, structures, materials, or characteristics may be combined in a suitable manner in any one or more embodiments or examples.

The forgoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display assembly, comprising:
a display panel including a plurality of sub-pixels; and
at least one optical film group each disposed on a display surface of the display panel, wherein each optical film group includes a quarter-wave plate, a reflective polarizer and an absorbing polarizer arranged sequentially along a thickness direction of the display panel, wherein
the reflective polarizer includes a reflective portion capable of allowing light with a polarization direction parallel to a polarization axis of the reflective polarizer to pass through and reflecting light with a polarization direction perpendicular to the polarization axis of the reflective polarizer; and an orthographic projection of an effective light-emitting area of at least one sub-pixel on a plane parallel to the display surface of the display panel is substantially within an orthographic projection of the reflective portion on the plane;
the absorbing polarizer is capable of allowing light with a polarization direction parallel to a polarization axis of the absorbing polarizer to pass through and absorbing light with a polarization direction perpendicular to the polarization axis of the absorbing polarizer; and the polarization axis of the reflective polarizer is parallel to the polarization axis of the absorbing polarizer;
the display panel is a bottom-emitting display panel, and the at least one optical film group includes one optical film group; and
the reflective polarizer further includes a plurality of light-transmissive portions, an orthographic projection of a non-light-emitting area of each sub-pixel on the plane is substantially within an orthographic projection of a respective one of the plurality of light-transmissive portions on the plane.

2. The display assembly according to claim 1, wherein the reflective polarizer is a wire-gird polarizer.

3. The display assembly according to claim 2, wherein the wire-gird polarizer includes a plurality of metal wires which are arranged at equal intervals, a width of each metal wire is in a range from 50 nm to 60 nm, and a fill factor of the wire-gird polarizer is in a range from 0.4 to 0.6.

4. The display assembly according to claim 1, wherein the orthographic projection of the reflective portion on the plane substantially coincides with the orthographic projections of effective light-emitting areas of the plurality of sub-pixels on the plane.

5. The display assembly according to claim 1, wherein the plurality of light-transmissive portions include at least one transparent portion and/or at least one opening.

6. The display assembly according to claim 1, wherein the display panel further includes a substrate disposed between the plurality of sub-pixels and the quarter-wave plate, wherein
the quarter-wave plate is in contact with a surface of the substrate facing away from the sub-pixels, the reflective polarizer is in contact with a surface of the quarter-wave plate facing away from the substrate, and the absorbing polarizer is in contact with a surface of the reflective polarizer facing away from the quarter-wave plate.

7. The display assembly according to claim 6, wherein the reflective polarizer includes a transparent base and metal wires disposed on the transparent base; and
the quarter-wave plate is disposed on surfaces of the metal wires facing away from the transparent base, and the absorbing polarizer is disposed on a surface of the transparent base facing away from the metal wires.

8. The display assembly according to claim 1, further comprising a substrate disposed between the reflective polarizer and the absorbing polarizer, wherein
the quarter-wave plate is in contact with the display surface of the display panel, the reflective polarizer is in contact with a surface of the quarter-wave plate facing away from the display panel, the substrate is in contact with a surface of the reflective polarizer facing away from the quarter-wave plate, and the absorbing polarizer is in contact with a surface of the substrate facing away from the reflective polarizer.

9. The display assembly according to claim 1, further comprising a substrate disposed between the quarter-wave plate and the reflective polarizer, wherein the quarter-wave plate is in contact with the display surface of the display panel, the substrate is in contact with a surface of the quarter-wave plate facing away from the display panel, the reflective polarizer is in contact with a surface of the substrate facing away from the quarter-wave plate, and the absorbing polarizer is in contact with a surface of the reflective polarizer facing away from the substrate.

10. A display device, comprising:
the display assembly according to claim 1; and
a driving assembly configured to provide display data and control signals to the display assembly.

11. An optical film group, wherein the optical film group is the optical film group in the display assembly according to claim 1.

12. A display assembly, comprising:
a display panel including a plurality of sub-pixels; and
at least one optical film group each disposed on a display surface of the display panel, wherein each optical film group includes a quarter-wave plate, a reflective polarizer and an absorbing polarizer arranged sequentially along a thickness direction of the display panel, wherein
the reflective polarizer includes a reflective portion capable of allowing light with a polarization direction parallel to a polarization axis of the reflective polarizer to pass through and reflecting light with a polarization direction perpendicular to the polarization axis of the reflective polarizer; and an orthographic projection of an effective light-emitting area of at least one sub-pixel on a plane parallel to the display surface of the display panel is substantially within an orthographic projection of the reflective portion on the plane;
the absorbing polarizer is capable of allowing light with a polarization direction parallel to a polarization axis of the absorbing polarizer to pass through and absorbing light with a polarization direction perpendicular to the polarization axis of the absorbing polarizer; and the polarization axis of the reflective polarizer is parallel to the polarization axis of the absorbing polarizer;
the display panel is a top-emitting display panel, and the at least one optical film group includes one optical film group disposed on the display surface of the display panel; and
orthographic projections of non-light-emitting areas of the plurality of sub-pixels on the plane are substantially within the orthographic projection of the reflective portion on the plane.

13. The display assembly according to claim 12, wherein the display panel has an active area, the plurality of sub-pixels are located in the active area, and the reflective portion covers the entire active area.

14. A display device, comprising:
the display assembly according to claim 12; and
a driving assembly configured to provide display data and control signals to the display assembly.

15. The display assembly according to claim 12, wherein the display panel further includes a substrate disposed on surfaces of the plurality of sub-pixels facing away from the display surface, the quarter-wave plate is disposed on a side of the plurality of sub-pixels away from the substrate, the reflective polarizer is in contact with a surface of the quarter-wave plate facing away from the plurality of sub-pixels, and the absorbing polarizer is in contact with a surface of the reflective polarizer facing away from the quarter-wave plate.

16. The display assembly according to claim 15, wherein the reflective polarizer includes a transparent base and metal wires disposed on the transparent base; and
the quarter-wave plate is disposed on surfaces of the metal wires facing away from the transparent base, and the absorbing polarizer is disposed on a surface of the transparent base facing away from the metal wires.

17. A display assembly, comprising:
a display panel including a plurality of sub-pixels; and
at least one optical film group each disposed on a display surface of the display panel, wherein each optical film group includes a quarter-wave plate, a reflective polarizer and an absorbing polarizer arranged sequentially along a thickness direction of the display panel, wherein
the reflective polarizer includes a reflective portion capable of allowing light with a polarization direction parallel to a polarization axis of the reflective polarizer to pass through and reflecting light with a polarization direction perpendicular to the polarization axis of the reflective polarizer; and an orthographic projection of an effective light-emitting area of at least one sub-pixel on a plane parallel to the display surface of the display panel is substantially within an orthographic projection of the reflective portion on the plane;
the absorbing polarizer is capable of allowing light with a polarization direction parallel to a polarization axis of the absorbing polarizer to pass through and absorbing light with a polarization direction perpendicular to the polarization axis of the absorbing polarizer; and the polarization axis of the reflective polarizer is parallel to the polarization axis of the absorbing polarizer;
the display panel is a double-sided light-emitting display panel, and the at least one optical film group includes a first optical film group and a second optical film group;
the first optical film group is disposed on a display surface of the display panel, the reflective polarizer in the first optical film group further includes a plurality of light-transmissive portions, and an orthographic projection of a non-light-emitting area of each sub-pixel on the plane is substantially within an orthographic projection of a respective one of the plurality of light-transmissive portions on the plane; and
the second optical film group is disposed on an opposite display surface of the display panel; orthographic projections of non-light-emitting areas of the plurality of sub-pixels on the plane are within the orthographic projection of the reflective portion of the reflective polarizer in the second optical film group on the plane.

18. The display assembly according to claim 17, wherein the display panel further includes a substrate disposed between the plurality of sub-pixels and the first optical film group,
in the first optical film group, the quarter-wave plate is in contact with a surface of the substrate facing away from the plurality of sub-pixels, the reflective polarizer is in contact with a surface of the quarter-wave plate facing away from the substrate, and the absorbing polarizer is in contact with a surface of the reflective polarizer facing away from the quarter-wave plate; and
in the second optical film group, the quarter-wave plate is in contact with surfaces of the plurality of sub-pixels facing away from the substrate, the reflective polarizer is in contact with a surface of the quarter-wave plate facing away from the plurality of sub-pixels, and the absorbing polarizer is in contact with a surface of the reflective polarizer facing away from the quarter-wave plate.

19. The display assembly according to claim 18, wherein the reflective polarizer in the first optical film group includes a first transparent base and first metal wires disposed on the first transparent base; the reflective polarizer in the second optical film group includes a second transparent base and second metal wires disposed on the second transparent base;

in the first optical film group, the quarter-wave plate is disposed on surfaces of the first metal wires facing away from the first transparent base, and the absorbing polarizer is disposed on a surface of the first transparent base facing away from the first metal wires; and in the second optical film group, the quarter-wave plate is disposed on surfaces of the second metal wires facing away from the second transparent base, and the absorbing polarizer is disposed on a surface of the second transparent base facing away from the second metal wires.

20. A display device, comprising:
the display assembly according to claim 17; and
a driving assembly configured to provide display data and control signals to the display assembly.

* * * * *